United States Patent
Lebel et al.

(10) Patent No.: US 6,319,093 B1
(45) Date of Patent: Nov. 20, 2001

(54) CHEMICAL-MECHANICAL POLISHING SYSTEM AND METHOD FOR INTEGRATED SPIN DRY-FILM THICKNESS MEASUREMENT

(75) Inventors: Richard J. Lebel, Williston, VT (US); Frederic Maurer, Valhalla, NY (US); Rock Nadeau, Jericho; Paul H. Smith, Jr., Essex Junction, both of VT (US); Hemantha K. Wickramasinghe, Chappaqua; Theodore G. van Kessel, Millbrook, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/777,380

(22) Filed: Feb. 6, 2001

(51) Int. Cl.[7] .................................................. B24B 37/00
(52) U.S. Cl. .................................................. 451/6; 451/41
(58) Field of Search .................. 451/5, 6, 41, 28, 451/63, 287, 288, 289, 397, 398; 356/381, 382, 318, 326, 328

(56) References Cited

U.S. PATENT DOCUMENTS

| | | |
|---|---|---|
| Re. 34,425 | 11/1993 | Schultz . |
| 4,998,021 | 3/1991 | Mimasaka . |
| 5,081,796 | 1/1992 | Schultz . |
| 5,220,405 | 6/1993 | Barbee et al. . |
| 5,433,650 | 7/1995 | Winebarger . |
| 5,442,828 * | 8/1995 | Lutz ...................................... 15/88.3 |
| 5,461,007 | 10/1995 | Kobayashi . |
| 5,492,594 | 2/1996 | Burke et al. . |
| 5,529,638 * | 6/1996 | Lutz ......................................... 134/6 |
| 5,640,242 | 6/1997 | O'Boyle et al. . |
| 5,777,739 | 7/1998 | Sandhu et al. . |
| 5,856,871 | 1/1999 | Cabib et al. . |
| 5,872,633 | 2/1999 | Holzapfel et al. . |
| 5,936,733 | 8/1999 | Sandhu et al. . |
| 5,948,203 | 9/1999 | Wang . |
| 5,949,927 | 9/1999 | Tang . |
| 5,958,148 | 9/1999 | Holzapfel et al. . |
| 5,961,369 | 10/1999 | Bartels et al. . |
| 5,999,264 | 12/1999 | Handa . |
| 6,020,264 | 2/2000 | Lustig et al. . |
| 6,020,968 * | 2/2000 | Horie ................................... 356/382 |
| 6,132,289 * | 10/2000 | Labunsky et al. ....................... 451/6 |
| 6,204,922 * | 3/2001 | Chalmers ............................. 356/381 |

FOREIGN PATENT DOCUMENTS

WO 95/18353   7/1995   (WO) .

OTHER PUBLICATIONS

Herbert E. Litvak, et al., "Implementing Real–Time Endpoint Control in CMP", *Semiconductor International*, Jul. 1996, pp. 259–264.

* cited by examiner

*Primary Examiner*—Derris H. Banks
(74) *Attorney, Agent, or Firm*—McGinn & Gibb, PLLC; Robert A. Walsh, Esq.

(57) ABSTRACT

A system and method that integrates film thickness measurements with a chemical-mechanical polishing (CMP) spin-dry tool. By doing so, each wafer can be measured as it comes out of the previous CMP process. Thickness measurement feedback is provided, which controls processing of the wafer and also monitor operational status of a CMP polishing unit prior to completion of the wafer being polished, resulting in significant cost and cycle time reduction through the elimination of tool infrastructure and wafer handling by assuring proper tolerances of the CMP polishing unit are maintained.

26 Claims, 4 Drawing Sheets

CHEMICAL-MECHANICAL POLISHING SYSTEM AND METHOD FOR INTEGRATED SPIN DRY-FILM THICKNESS MEASUREMENT

BACKGROUND OF THE INVENTION

1. Field of the Invention

This invention relates generally to chemical-mechanical planarization or polishing (CMP) tools and, more particularly, to a system and method, which combine workpiece film measurements with a spin-dry process.

2. Description of the Related Art

Briefly, the chemical mechanical polishing process requires that a workpiece be held, with the desired coated surface face down, on a polishing pad supported on a rotating table, in the presence of an abrasive slurry. A chemical mechanical polishing machine (unit) can include a single rotating polishing plate and a smaller diameter rotating wafer carrier to which a wafer (or wafers) is (are) mounted. The wafer carrier is held above the polishing plate, in either a stationary fixed position or oscillating back and forth in a predetermined path, while both polishing plate and wafer carrier are rotated about their respective center axes. A slurry, consisting of an abrasive suspension with or without an etching reagent, is fed onto the polishing plate during polishing of the wafer. The slurry, also referred to as a carrier liquid, can be selected to include an etchant for the coating being planarized and for not substantially attacking other materials involved in the process. The slurry is further fed between the polishing plates to polish and flush away the material removed from the semiconductor wafer. Current CMP tools are built with a constrained processing sequence whereby wafers are loaded from a cassette, polished, rinsed, cleaned, dried and unloaded. In some cases there are multiple polish steps where a wafer is polished first in one polishing medium, rinsed, polished in a second medium, rinsed, cleaned, dried and unloaded.

In particular, when using various CMP polishing tools in processing a wafer where a sufficient amount of surface films has been polished (removed by grinding), the wafer is rinsed and cleaned to remove slurry and then dried in a spin-dry process using a CMP spin-dry tool. Further, when a CMP process polishes transparent materials such as oxides and nitrides in addition to metals, the process is typically controlled by performing an optical film thickness measurement. For example, back end silicon dioxide layers are typically polished from a starting thickness of 20000 angstroms to a final thickness of 10000 angstroms. To control the process, wafers have to be removed periodically from the spin dryer and measured on an optical film thickness measurement tool that examines the film reflectivity spectrum across a range of optical wavelengths to determine the thickness of material from the optical fringe pattern. Thickness measurements are typically made at many points on the wafer (usually six or more). The deviation of this thickness value from a desired value is used to adjust the polish time for subsequent wafers up or down to assure that they are polished to the correct thickness.

The measurement of thin films on semiconductor and other micro-manufactured parts is typically performed by an optical interference technique in which the reflectance or transmission properties are measured using an optical probe using a separate apparatus. Then, the acquired spectrum is analyzed with a computer program referred to as a "recipe" using known film properties and physics to solve for unknown properties such as film thickness, density etc. For ideal films having one or more perfectly flat layers, these measurements are straight forward and well documented.

However, prior to the invention, there has been no effective structure or operation that minimizes the number of steps or machines used to perform this process, which is slow and expensive since wafers being processed must be manually loaded into a stand alone optical film thickness measurement tool. This represents significant delay between the time the wafer is polished and the time the film thickness measurement is completed. Where precise control is essential, the process is halted until the thickness measurement results are known. This causes both the introduction of additional errors due to tool drift during idle time and cost in terms of process cycle time.

In addition, known processes have had to stop processing and determine variations of thickness of a wafer being processed to determine whether the CMP polishing unit is operating within acceptable tolerances to control basic thickness of the resultant polished films on the wafer. When the CMP polishing unit is in need of maintenance and/or out of tolerance, this state of operation incurs processing error, thus additional unwanted processing expense. This is generally caused by the CMP polishing pads wearing out and in need of replacement, and the polishing tool often needs to be calibrated and adjusted. Mechanical part wear and failure is evident when examining the thickness distribution of a polished wafer. The normal polish distribution on a wafer is a radially symmetric distribution which is typically low in variation magnitude. When the range or distribution of thickness values becomes unusually large, this is interpreted as need for maintenance, which is slow and expensive.

SUMMARY OF THE INVENTION

In view of the foregoing and other problems, disadvantages, and drawbacks of the conventional methods and structures, an object of the present invention is the ability to perform integrated film measurement system with a chemical-mechanical polishing process' spin-dry tool using optical probe(s) mounted in an optical line-of-sight of a surface of a workpiece in the CMP spin-dry tool.

Another object of the invention is to retain the accuracy advantages inherent in optical interference film measurements for performing optical interferometric measurements of film properties in conjunction with established optical detection and signal analysis methods. Also, by doing such measurements, the number of steps involved with a CMP process are minimized, thereby enabling a continuous processing of wafers without need for removal of the wafer from a CMP spin-dry tool to perform thickness/composition measurements.

A further object of the invention is to provide continuous monitoring of operational tolerances of the CMP polishing unit for more cost effective manufacturing of wafers.

One aspect of the present invention provides integration of a thickness measurement probe with an appropriate measurement and processing CMP controller subsystem with a CMP spin-dry tool. By doing so, each wafer can be measured as it comes out of the previous CMP process. Thickness measurement feedback is provided, which controls processing of the wafer and also monitor operational status of the CMP polishing unit prior to completion of the wafer being polished. In so doing, significant cost and cycle time reduction results through the elimination of tool infrastructures and handling by ensuring proper tolerances of the CMP polishing unit are maintained. Additionally, significant control advantage is afforded by having a tighter control loop with more measurements thereby resulting in improved polishing precision. By using an integrated CMP spin dry tool with film thickness measurement system in one system that includes at least two probes, significant cost savings occur.

Further, the present invention includes, in preferred form, a CMP spin-dry tool that has at least two multi-pass optical probes mounted in a hood member that perform measurements of the wafer during a spin-dry process. The probes perform optical thin film thickness and composition measurements, which includes an optical light source for emitting light to the wafer, a detector for detecting the light reflected from the wafer, one of a spectral dispersion element and a filtration element constructed to propagate light from the light source to wafer surface films under examination, and back to the detector such that a given ray of light passes through substantially a same location on the wafer at least two times. The determination of thin film properties of thickness and composition can be measured with inexpensive compact, vibration insensitive, topography insensitive and alignment insensitive optical interference probes, the accuracy advantages inherent in optical interference film measurements are retained, and thin film properties are measured in-situ during a spin-dry operation of a workpiece (wafer).

Further, the aforementioned advantages drive an overall reduction of the number and complexity of processing steps in the production of semiconductor wafers. Indeed, the present invention use of an integrated approach of CMP processing is a significant cost saving item compared to conventional methods that the present invention avoids.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED

Embodiments of the Invention

Figure 2:
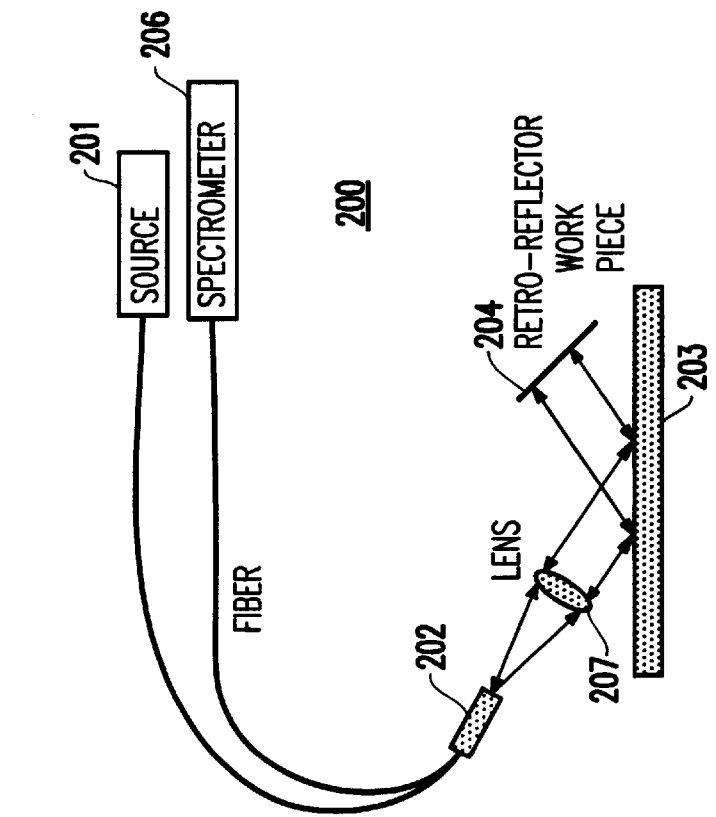
FIG. 2 illustrates a structure 200 according to a second-type of probe used with the CMP system of the invention.

Referring now to the drawings, and more particularly to FIGS. 1–6, there are shown preferred components of the system according to the present invention.

Generally, included with the CMP spray-dry tool system of the invention is an integrated measurement probe, wherein the probe can be either an optical probe, an inductive coupling-type probe, or a capacitive-type probe. In preferred form, the probe is an optical interference-type multi-pass optical probe, which is constructed for performing optical thin film thickness and composition measurements during CMP processing as well as provide feedback control of the polishing process so as to monitor the CMP system operational tolerances. The class of probes used in the optical measurement type system includes an optical light source, a detector, a spectral dispersion and/or filtration elements and optics constructed to propagate light (e.g., broadband light having more than one wavelength) from the probe to the workpiece (wafer) surface films under test, and back to the detector such that a given ray of light passes through the same location on the wafer two or more times always along the same optical path.

Figure 1:
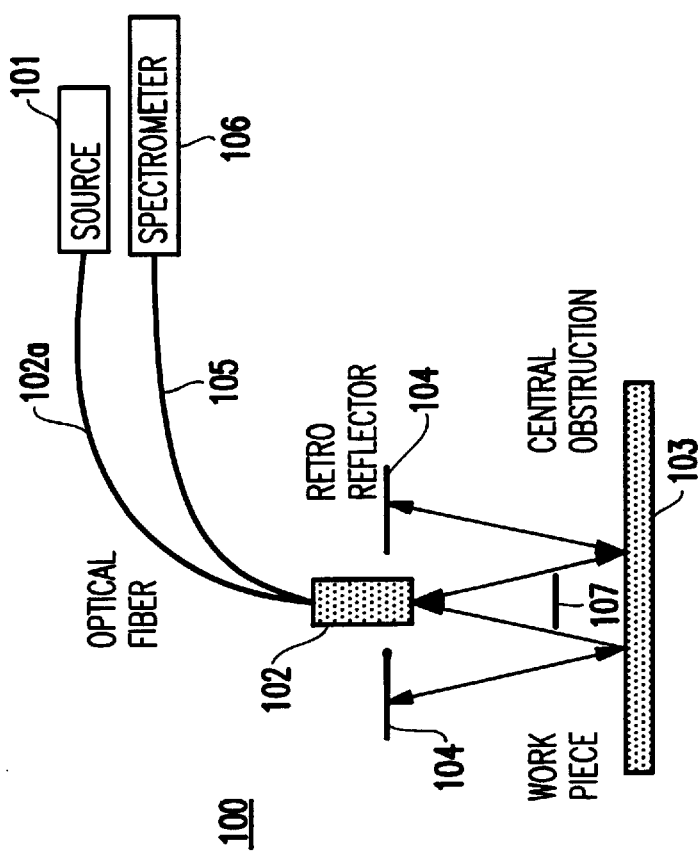
FIG. 1 illustrates a structure 100 according to a first-type of probe used with the CMP system of the invention.
Figure 4:
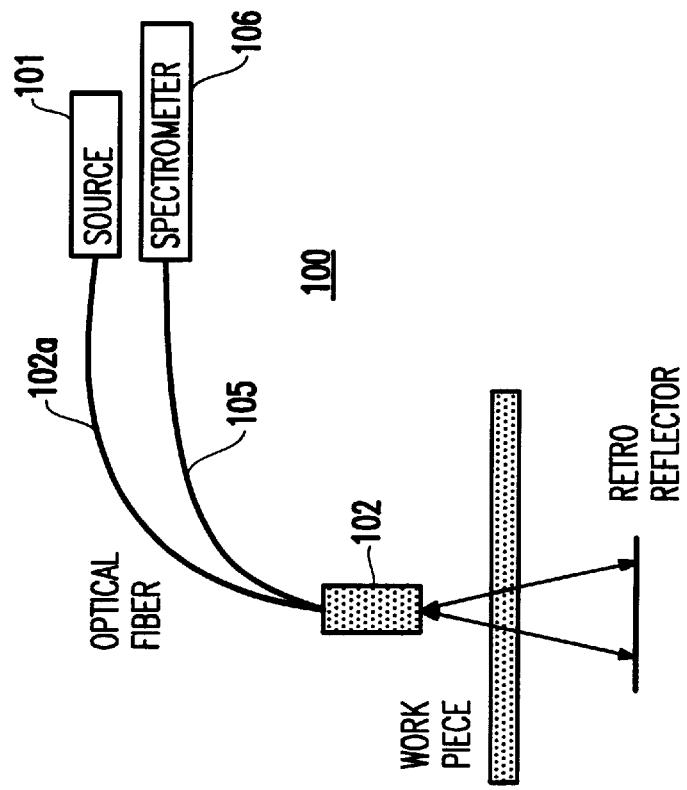
FIG. 4 illustrates a structure 400 according to a fourth first-type of probe used with the CMP system of the invention.
Figure 3:
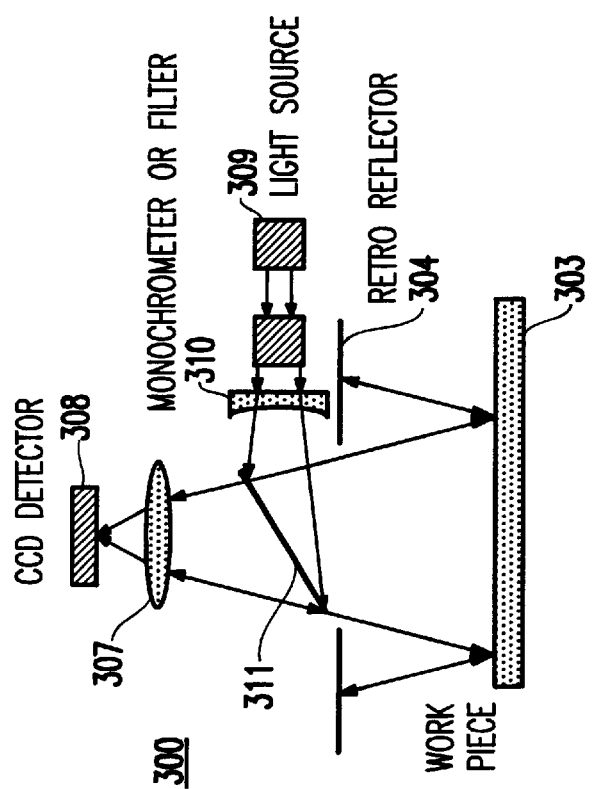
FIG. 3 illustrates a structure 300 according to a third-type of probe used with the CMP system of the invention.

FIGS. 1, 2, and 3 illustrate this concept in three practical, exemplary, non-limiting embodiments for reflective measurements. FIG. 4 illustrates this concept in transmission. These four probe embodiments are disclosed in U.S. patent application Ser. No. 09/635,202, filed Aug. 9, 2000, and entitled "System and Multipass Probe for Optical Interference Measurements," which is hereby incorporated by reference.

A key characteristic of each of these embodiments of the probe is the introduction of a retroreflective element positioned and sized to reflect light passing through a specific region of space back along the path it came. A retroreflector is defined as a surface or material which returns incident light in substantially the exact same direction from which it came. It may (or may not) be along the same optical path depending upon the configuration of the retroreflector.

For example, a corner cube will send a light ray back in the opposite direction but the ray will be offset slightly (e.g., very close, but parallel, to the original path). However, retroreflective tape is advantageous in that it sends the light back in the opposite direction and substantially along the same optical path. Thus, the exact retrace of the path will depend upon the type of retroreflective component used.

The multi-pass functionality and spatial filtration are achieved with the introduction of the retroreflective element. In practice, this can be achieved using mirrors, lenses, fibers, etc. Thus, while the inventors have found that the most practical method is to use retroreflective tapes and films, other components may be used including a retroreflective cube such as corner reflectors, quarter cube with mirrors, etc.

The retroreflector in the combination of the probe head design has many properties and derivative qualities which provide unexpectedly superior results. First, the retroreflector is alignment-insensitive. That is, the conventional system may employ a mirror as a conventional reflector. However, a mirror requires exact, precise alignment. The retroreflector in the probe of the present invention does not require such an alignment.

Further, since the light from the retroreflector of the probe goes through the wafer (material) twice, there is an enhanced interference (signal) contrast similar to light going through an optical filter twice.

Finally, the retroreflectors may be used in a confocal geometry such that if light is output from a fiber, then the light (e.g., specular component of the light) will fly right back in from where it came.

The above features provide enormous advantages and allow the probe head design to be used with optical fiber, imaging situations (e.g., see FIG. 3), etc.

FIG. 1 illustrates a first embodiment of the probe head design, and more specifically to a near normal incidence probe 100 that has been used in early process layers of semiconductor parts.

In FIG. 1, light is emitted from a source 101 along a fiber 102a in a cone, reflects off the wafer surface 103 under test, and retro reflects off a retro-reflector 104. The light returns to the fiber bundle 102 along the path it came through the wafer 103. A central obstruction mask 107 is placed to prevent specular (single pass) light from returning to the bundle. The light is measured by a detector 106 (e.g., a spectrometer). This first embodiment of the probe head design is the preferred form for use with the CPM system described herein. This design is especially useful in measurements of back-end oxide films. This first probe head embodiment combines ease of wafer fabrication and has excellent topography rejection.

Light that scatters from surface topography is effectively lost from the beam and does not return to the detector fiber 105 and that the light travels through the film stack twice. This effectively makes the probe most sensitive to the planar regions of the wafer 103 where light is specularly reflected. In this case, the range of angles is constrained by the numerical aperture (N.A.) of the fiber, the inner and outer diameter and position of the retroreflector and the central obstruction. By adjusting these variables, precise spatial beam properties can be achieved. It is noted also that even large angle variations of the wafer do not affect the properties of the beam. By rejecting topographic influences, precise positioning of the beam among the work piece is significantly less critical.

FIG. 2 illustrates a collimated beam at a large angle of incidence in a probe 200 according to a second embodiment of the probe, having a source 201, fiber bundle 202, retroreflector 204, fiber 205, and detector 206 similar to those of FIG. 1. An objective lens 207 is provided between the fiber bundle and 202 and the wafer 203 for focusing the output from the wafer.

The probe 200 inherits the property that topography is rejected and improves overall interference signal contrast by constraining the range of angles. This range of angles may be tailored to the application (e.g., the present inventors have found +/−10 degrees or so to be useful). Small spot or narrow beam profiles can be achieved with this configuration. Both FIGS. 1 and 2 are effectively confocal in that they take light from a small aperture and return it through a small aperture. This also contributes to good interference signal contrast. In both cases, the detector 106, 206 is a spectrometer connected to the probe by a bundle of one or more fibers.

FIG. 3 illustrates the use of the multipass concept in bulk optics (e.g., in an imaging configuration). In this configuration, large areas of a wafer can be examined at high resolution by introducing an array detector (e.g., a charge-coupled device) 308 and an extended source 309. Further included are an objective lens 307, a convex lens 310 and a reflector 311. Because of the properties of the retro reflector 304, this configuration is an effective analog of many FIG. 2 systems in one package. FIG. 4 illustrates the multipass concept in transmission, and specifically the configuration of this particular embodiment is similar to FIG. 1.

Figure 5A:
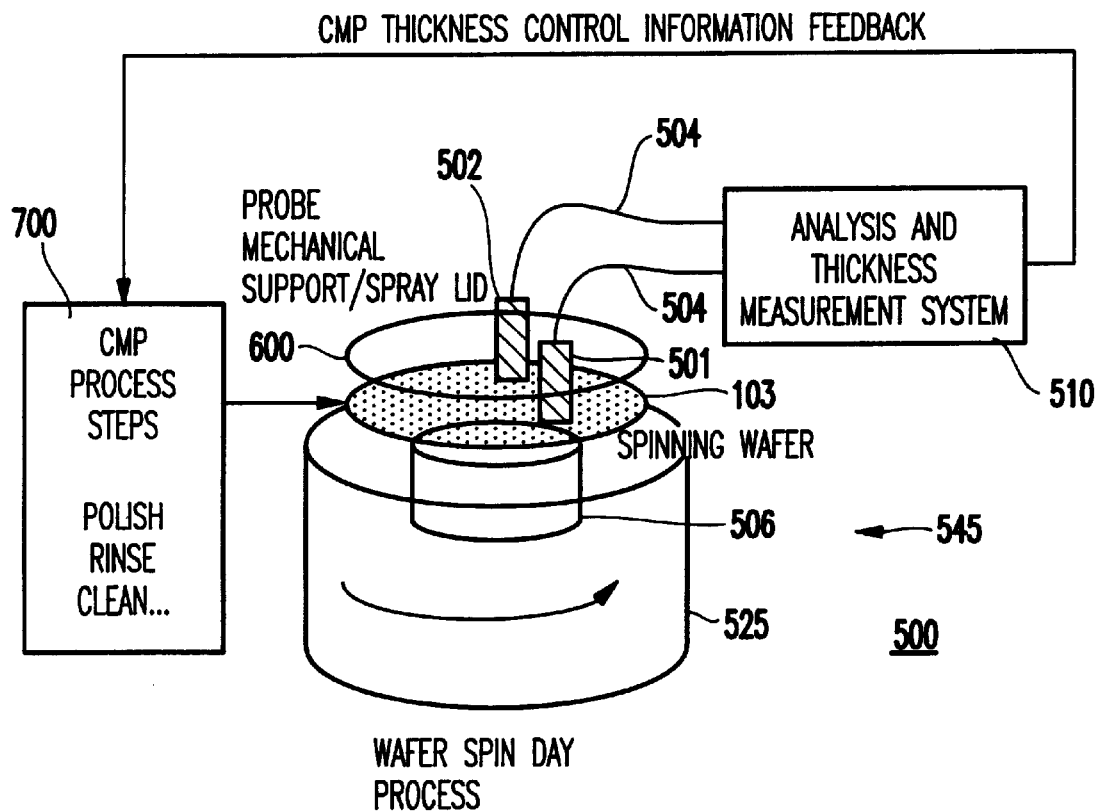
FIG. 5a and FIG. 5b illustrate the system in schematic form according to the invention.

Referring now to FIG. 5a, a CMP system 500 is shown using a probe(s) mounted in an optical line-of-sight of a surface of a workpiece in a CMP spin-dry tool, wherein the optical film measurement probe(s) are capable of performing film thickness measurements of a spinning wafer and operatively communicating these thickness measurements for process control. By using in-situ integration of the optical thickness measurement with the wafer spin dry process, each wafer as it comes out of the previous CMP process steps provides the necessary feedback for control of the system before the next wafer is done being polished. By doing this, significant cost and cycle time reductions occur because of the elimination of tool infrastructure and handling of wafers being processed. A significant control advantage also occurs by having a tighter control loop with more measurements to achieve greater polishing precision.

In FIG. 5a, preferably at least two probes 501 and 502 are incorporated in a support/spray hood member 525 that covers a spin dry tank (not shown for clarity), an enclosure that captures debris during the polishing and water spray. Alternatively, the two or more probe heads 501, 502 are arranged at different radial distances which are operational as the wafer is spinning during processing. By doing as such, measurements along rings of constant radiuses on the wafer being processed can be determined. This enables detection of changes in the thickness distribution of the wafer being processed and whether the polishing CMP tool has proper tolerance.

The probes 501 and 502 preferably use one of the four designs described above forming part of the optical interferometric film measurement in the film thickness measurement system 510. Alternatively, measurement systems that involve inductive or capacitive coupling measurements of metal based films on fabricated wafers can also be used in place of the optical head probe. Such probes can be fabricated with a similar physical aspect (i.e., physical dimensions and tolerances), but are less precise when compared to a preferred optical probe head design as discussed above since the are more sensitive to alignement relative to the wafer.

The probes 501, 502 are each connected through appropriate connections 504 (via optical fibers to a separate computer/spectrometer in optical-type probes) film thickness measurement system 510 that is used to analyze the film thickness data, compute the film thickness and provide feedback information as to the operational tolerances evinced by the CMP polishing tool. By measuring a distribution of thickness on the wafer, determinations of polishing CMP tool operational tolerances can be performed during spin-dry cleaning of the wafer. The normal polish distribution on a wafer is a radially symmetric distribution which is typically low in variation magnitude. By using at least two probes 501 and 502, this condition can be continuously monitored and provide this CMP polishing tool tolerance information.

In operation, a workpiece (wafer) being processed, is held on a rotating chuck 506 at the end of a robot arm (not shown) and positioned over the rinse tank 525 in a water spray following the polish operation. The spray nozzle and/or air dry nozzle can be incorporated with the probe housing. Film thickness is measured using the optical system as described above. Using the system of the invention, the optical probes 501 and 502 are positioned in direct sight of the surface film of the wafer being processed and continuously measured, wherein optical reflectance spectra are observed and analyzed to determine the film thickness.

A persistent difficulty in the fabrication of wafers is the inability to determine when a required thickness or endpoint has been reached during a dielectric polishing step. One method of determining the required thickness or CMP endpoint is by using estimated CMP rates and times. CMP rates vary considerably with time however, due to changes in polishing pad characteristics, as an example. Frequent stops are required in the fabrication process for ex-situ optical thickness measurements. With ex-situ thickness measurements, the method is extremely time consuming and highly undesirable since operators must handle, unload, and dry each wafer after a polishing phase and before making the ex-situ thickness measurement. Process throughput is thereby reduced and product yields are lowered.

By using the system 500 with the at least two probes 501 and 502 that are housed and adapted to function in either water or air environments, a more precise CMP endpoint detection method is achieved. Performing the film thickness measurement in the rinse area of the CMP tool allows this critical process control information to be acquired immediately and in situ from the wafer being processed, thereby saving significant process time and improving process control loop effectiveness.

Control afforded by the CMP process 700 is achieved by measuring outgoing wafer film thickness and adjusting polish time when thickness deviations from the desired thickness are discovered. The control measurement uses film thickness as the polish control measurement. The film thickness measurement of a wafer being processed is during the rinse cycle and the spin dry cycle. During this time, the wafer surface is mechanically accessible and clean (having been rinsed with water spray). Measurements are done by the system 500 when the work piece is either wet or dry. In the case of dry measurements, it is necessary to blow the water off with suitable jets. Since this process can introduce contamination, it is desirable to be able to return the wafer from rinse to polish for a few seconds to perform a touch up to remove the contamination followed by a standard rinse. In either the wet or dry measurement mode, it is desirable to be able to measure the film thickness and return the wafer to polish. In addition to film thickness measurement during or after the polish process, it is often desirable to know the incoming film thickness. This is desirable for two reasons. First, in the event that the surface film is incorrect in terms of thickness of composition, it is desirable to know this in advance of the polish process to avoid damage. Secondly, the detailed knowledge of incoming film thickness allows for more accurate estimation of the polish time and reduces the need for subsequent verification measurements.

Figure 5B:
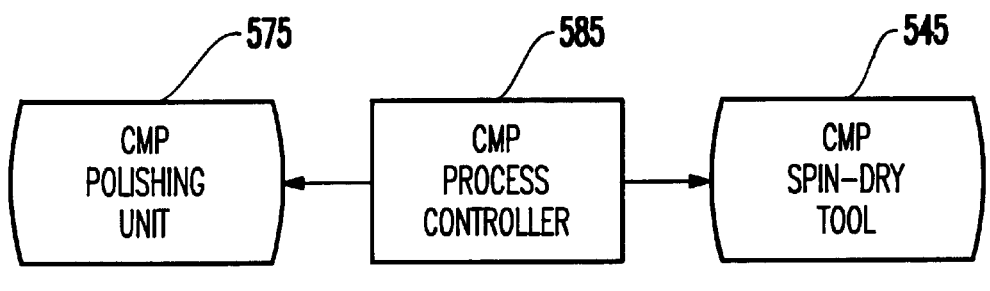

Referring now to FIG. 5b, the CMP system 500 includes the CMP polishing unit 575 that is controlled by the control processor 585 that receive measurement signals from the CMP spin-dry tool via probes 501 and 502 mounted in an optical line-of-sight of a surface of a workpiece in the CMP spin-dry tool 545, the film measurement probe being capable of performing film thickness measurements of a spinning wafer and communicating thickness measurements to the analysis and thickness measurement system 510 forming part of the CMP processor controller. The various CMP tools can be housed in one or multiple units depending upon the CMP processing requirements.

Figure 6:
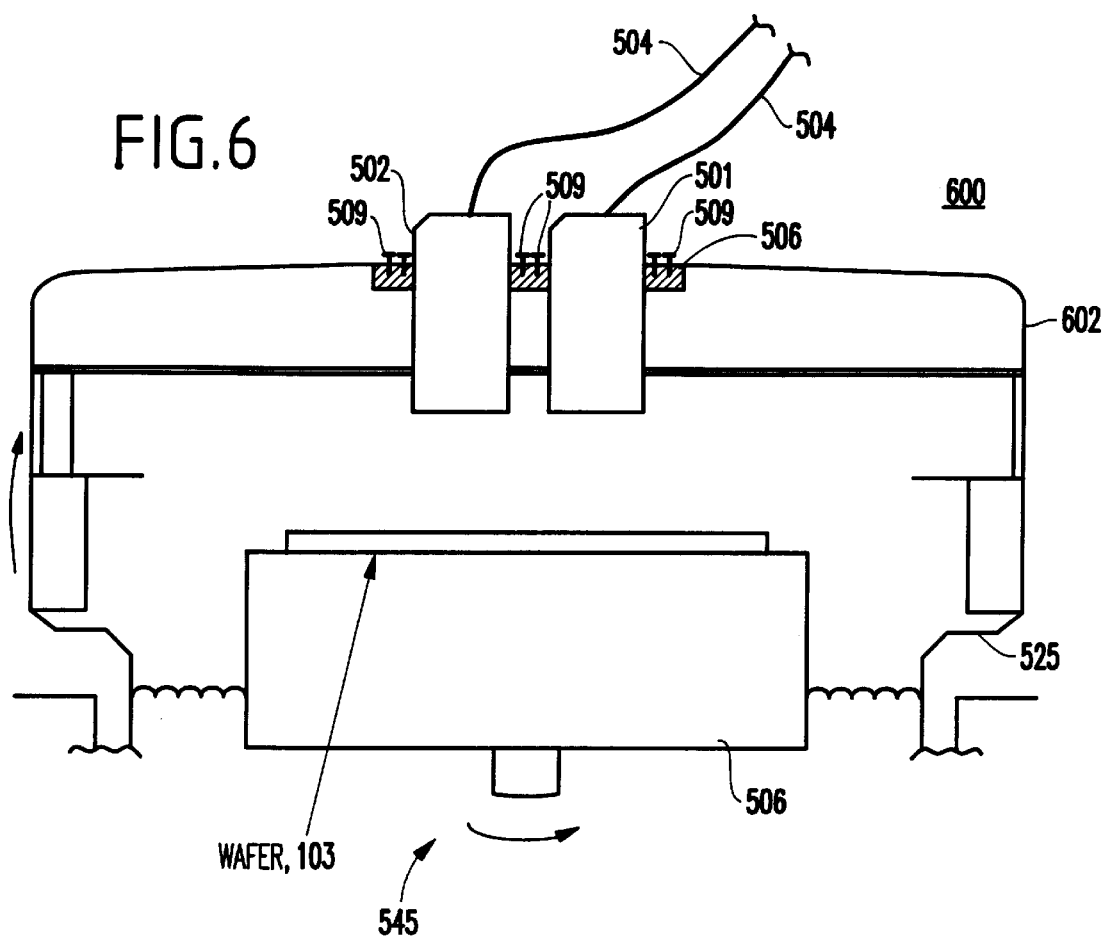
FIG. 6 shows the hood member with attached probes.

Referring now to FIG. 6, the spin-dry CMP tool 600 is shown in cross-section showing the probes 501 and 502 mounted in a hood member 602. The probes are mounted to a probe carrier with adjustment screw for proper alignment. The hood member 602 is preferably a hinged member that allows access to the workpiece (wafer) using a robotic arm (not shown) after a polishing process by a CMP polishing tool. Alignment screws 509 are optional when assembling the optical probe heads 501, 502 since they do not require precise alignment.

Figure 7:
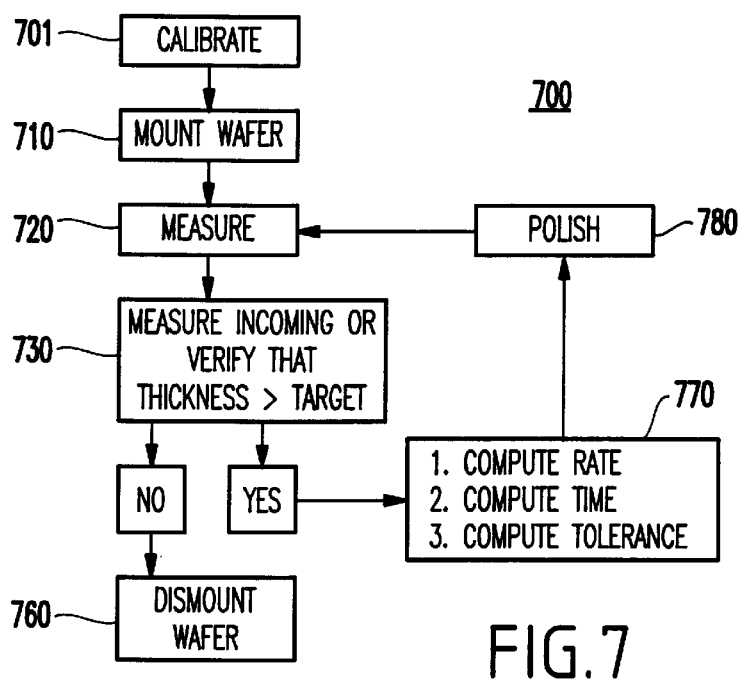
FIG. 7 shows a flow diagram of the processing steps used to ensure proper tolerances of the CMP polishing tool are maintained.

Referring now to FIG. 7, a flow diagram of the process 700 is shown depicting a sequence of steps for a typical polishing operation using the system 500. The calibration procedure 701 is typically performed with a CMP polishing unit prior to the processing of a group of wafers. This procedure includes calibrations of the film thickness probes 501 and 502 and loading a polishing sequence "recipe" and reference data into the analysis and thickness measurement system 510 to accommodate the wafers of the job. Next, the wafer is loaded into the wafer carrier chuck 506, typically locked on by vacuum, and positioned in the CMP spin-dry tool 545. A first measurement is made of the thickness for polishing position to polish again at step 780. Polishing 780 proceeds for the time prescribed by the system process controller and the wafer is returned to the CMP spin-dry tool 545 and a second measurement is made at step 720. The CMP system process controller then 1) calculates a polishing rate, 2) computes the next polishing time period and 3) determines a distribution of thickness on the wafer for determining whether permissible operational tolerance of the CMP polisher unit is maintained. In computing tolerances in step 730, a wafer has a normal radial polishing distribution that is symmetrical and typically low in magnitude variation. Thickness measurements are made of incoming wafers or verifying that thickness is greater than a desired target thickness at step 730.

By using at least two probes 501 and 502, this condition can be continuously monitored. If these tolerance measurements are not acceptable at step 770 during processing of a batch of wafers, the process is stopped and polishing pads replaced in the polishing unit 575. This cycle is repeated, each time comparing the measurement thickness to the target thickness, and the polishing distribution at step 730, re-computing a polishing rate and determining a new polishing time and determining whether the CMP polishing unit is within tolerance. When the test 730 indicates an end point, the wafer is dismounted at step 760, and a new wafer is mounted and the process is started anew. As the measured thickness approaches the target thickness, the computed polishing time periods become smaller according to the "recipe" stored in the processor.

Thus, with the unique and unobvious aspects of the invention, a CMP spin-dry system is provided in which thin film properties of thickness and composition can be measured with an inexpensive compact, vibration insensitive, topography insensitive and alignment insensitive optical interference probe(s) mounted in an optical line-of-sight of a surface of a workpiece in the CMP spin-dry tool, the accuracy advantages inherent in optical interference film measurements are retained, and thin film properties are measured in-situ relative to the CMP process environment. The invention forms part of a spin-dry tool in a CMP system. The physical implements used for housing the invention include either a stand-alone unit apart from the other tools of the CMP system, but use the processor that is incorporated in a section of the system. Alternatively, the housing of the invention can physically form part of an integrated post-brush clean tool, or a polisher-brush cleaner tool.

While the invention has been described in terms of several preferred embodiments, those skilled in the art will recognize that the invention can be practiced with modification within the spirit and scope of the appended claims. For example, it is noted that the invention can be incorporated into a system with a spectrometer. Such a spectrometer can be either an FTIR spectrometer having an interferometer on the back end, or a dispersive-type spectrometer. Moreover, although the preferred use is for semiconductor wafer polishing in a rinse tank type of housing, other applications of the invention include measuring of plating in thin-film heads (NiFe).

Having thus described our invention, what we claim as new and desire to secure by Letters Patent is as follows:

1. A chemical-mechanical polishing (CMP) system, the system comprising:

a CMP spin-dry tool;

at least one optical film measurement probe mounted in an optical line-of-sight of a surface of a workpiece in said CMP spin-dry tool, said optical film measurement probe being capable of performing film thickness measurements of a spinning wafer and operatively communicating said thickness measurements for process control.

2. The system of claim 1, wherein said system further comprising a process controller for receiving said thickness measurements for controlling a CMP polishing unit.

3. The system of claim 2, wherein said process controller comprises a spectrometer and said measurement probe comprises:

a light source;

a light collector or detector for receiving reflected light; and a retroreflective element for reflecting light toward said light collector.

4. The system of claim 3, wherein said retroreflective element reflects light along an incident path of said light.

5. The system of claim 3, wherein said retroreflective element comprises one of a retroreflective tape and a corner reflector.

6. The system of claim 3, wherein said retroreflective element comprises a corner reflector.

7. The system of claim 2, wherein said spectrometer comprises one of a dispersive-type spectrometer, an interferometric-type spectrometer and an image-type spectrometer.

8. The system of claim 1, wherein said spin-dry tool further comprises:

a tank housing;

a rotating chuck within said tank housing configured to mount said work piece; and a hood member covering said tank wherein said at least one probe is attached to said hood.

9. The system of claim 8, wherein at least two probes are mounted, whereby operational status of requisite operational tolerances of said CMP polishing unit.

10. The system of claim 1, wherein said spin-tool forming part of said CMP system comprises a stand-alone unit.

11. The system of claim 1, wherein said spin-tool forming part of said CMP system comprises part of an integrated post-brush clean tool.

12. The system of claim 1, wherein said spin-tool forming part of said CMP system comprises part of an integrated polisher-brush clean tool.

13. A system for polishing a workpiece, said system comprising:

a chemical-mechanical polishing (CMP) unit; and a spin-dry tool having at least one measurement probe adapted to measure surface thickness of said workpiece during a spin-dry process, and communicating said thickness measurements to a process controller in said CMP unit.

14. The system of claim 13, wherein said process controller comprises a spectrometer.

15. The system of claim 13, wherein said measurement probe comprises:

a light source;

a light collector or detector for receiving reflected light; and a retroreflective element for reflecting light toward said light collector.

16. The system of claim 15, wherein said retroreflective element reflects light along an incident path of said light.

17. The system of claim 15, wherein said retroreflective element comprises one of a retroreflective tape and a corner reflector.

18. The system of claim 15, wherein said retroreflective element comprises a corner reflector.

19. The system of claim 13, wherein said spectrometer comprises one of a dispersive-type spectrometer, an interferometric-type spectrometer and an image-type spectrometer.

20. The system of claim 13, wherein said spin-dry tool further comprises:

a tank housing;

a rotating chuck within said tank housing configured to mount said work piece; and a hood member covering said tank wherein said at least one probe is attached to said hood.

21. The system of claim 20, wherein at least two probes are mounted, whereby operational status of requisite operational tolerances of said CMP polishing unit.

22. The system of claim 13, wherein said spin-tool forming part of said CMP system comprises a stand-alone unit.

23. The system of claim 13, wherein said spin-tool forming part of said CMP system comprises part of an integrated post-brush clean tool.

24. The system of claim 13, wherein said spin-tool forming part of said CMP system comprises part of an integrated polisher-brush clean tool.

25. A method of integrated monitoring of tolerances of a chemical mechanical polishing (CMP) system using a spin-dry tool having at least one film thickness measurement probe mounted in an optical line-of-sight of a surface of a workpiece in said CMP spin-dry tool, said at least one probe operatively coupled to a system processor, the method comprising:

measuring a film thickness of said work piece with said probe during spin-dry processing of said work piece;

comparing prior film thickness of said work piece;

determining whether further polishing of said work piece is required.

26. The method of claim 25, wherein said system includes providing at least two probes and said method of comparing said prior film thickness of said work piece includes measurements along rings of constant radius on said workpiece for determining whether CMP polishing unit tolerances are maintained.

* * * * *